United States Patent [19]
Scott, III

[11] Patent Number: 5,187,390
[45] Date of Patent: Feb. 16, 1993

[54] INPUT SAMPLING SWITCH CHARGE CONSERVATION

[75] Inventor: Baker P. L. Scott, III, Austin, Tex.

[73] Assignee: Crystal Semiconductor Corporation, Austin, Tex.

[21] Appl. No.: 729,355

[22] Filed: Jul. 12, 1991

[51] Int. Cl.⁵ .................. H03K 17/16; G11C 27/02
[52] U.S. Cl. ........................... 307/353; 307/491; 307/494; 307/572; 328/128
[58] Field of Search .......... 307/352, 353, 355, 491, 307/494, 572; 328/128

[56] References Cited

U.S. PATENT DOCUMENTS

| | | | |
|---|---|---|---|
| 3,586,880 | 6/1971 | Fitzwater, Jr. | 307/572 |
| 4,323,796 | 4/1982 | Lathrope | 307/572 |
| 4,393,318 | 7/1983 | Takahashi et al. | 307/353 |
| 4,585,956 | 4/1986 | Lie | 307/572 |

FOREIGN PATENT DOCUMENTS

| | | | |
|---|---|---|---|
| 0194700 | 8/1986 | Japan | 307/353 |
| 0067817 | 3/1990 | Japan | 307/572 |

Primary Examiner—John Zazworsky
Attorney, Agent, or Firm—Leonard & Lott

[57] ABSTRACT

A switched capacitor input circuit that reduces nonlinear input current due to input switch charge injection. The addition of a shunt capacitor with a series switch to signal ground at the input switch of a sampling network is used to sample and hold the input switch charge injection. This input switch charge injection can then be returned as input switch channel charge during the next sampling phase eliminating the need for the input signal to supply this charge.

11 Claims, 3 Drawing Sheets

INPUT SAMPLING SWITCH CHARGE CONSERVATION

TECHNICAL FIELD

The present invention generally relates to switched capacitor circuits; and, more particularly, circuits for reducing nonlinearities in switched capacitor circuits.

BACKGROUND OF THE INVENTION

Extremely linear switched capacitor circuits have many applications in data convertors and signal processing. For example discrete time analog to digital convertors used in producing compact discs and digital audiotapes require switched capacitor circuits which are extremely linear. These switched capacitor circuits generally include operational amplifiers, MOSFET switches and integrated capacitors.

There has been a lot of effort toward linearizing these circuit elements and most of the first and second order effects on linearity are well understood. For example operational amplifiers are known in the art which have gains in excess of one million, and integrated capacitors approach linearity to one part per million. As a result the primary remaining cause of nonlinear circuit performance of switched capacitors circuits is the MOSFET switches and their nonlinear charge injection.

SUMMARY OF THE INVENTION

It is, therefore, an object of this invention to reduce the effect of the nonlinear charge injection of a MOS switch in a switch capacitor circuit.

Shown in an illustrated embodiment of the invention is a capacitor charging circuit which includes a first switch coupled between an input signal and a first node, a first capacitor with its first terminal coupled to the first node with the second terminal of the first capacitor coupled to a signal ground through a second switch. The nonlinearities caused by the switching action of the first and second switches are reduced by a series combination of a shunt capacitor and a third switch coupled between the first node and a signal ground. The capacitor of the series combination having its first terminal connected to the first node and its second terminal coupled to a signal ground through the third switch.

In the further aspect of the invention after the first capacitor is charged the switches are made sequentially nonconductive by first turning off the second switch, then the first switch, and finally the third switch.

Also shown in an illustrated embodiment of the invention is a method for storing switch charge injection on a capacitor which would otherwise be dissipated and produce nonlinear input current. This method includes the steps of passing an input signal through a first switching device onto a first terminal of the series capacitor while the second terminal of the series capacitor is coupled to a signal ground through a second switching device. The first terminal of the series capacitor is also coupled to a signal ground through the series combination of a shunt capacitor and a third switching device. The second switching device is then opened while the first and third switching devices are conductive, and then the first switching device is opened while the third switching device is conductive and the second switching device is nonconductive. Finally the third switching device is opened while the first and second switching devices are nonconductive.

BRIEF DESCRIPTION OF THE DRAWINGS

The aforementioned and other features, characteristics, advantages, and the invention in general, will be better understood from the following, more detailed description taken in conjunction with the accompanying drawings in which.

It will be appreciated that for purposes of clarity and where deemed appropriate, reference numerals have been repeated in the figures to indicate corresponding features, and that the timing signals shown in FIGS. 1B, 2B, 3B, and 4B have not necessarily been drawn to scale in order to more clearly show timing relationships used in the present invention.

DESCRIPTION OF THE PREFERRED EMBODIMENT

A switched capacitor circuit according to one embodiment of the present invention utilizes a series combination of a shunt capacitor having a first terminal tied to the first terminal of an input capacitor and a switch coupled from the second terminal of the shunt capacitor to a signal ground. The first terminal of the input capacitor is also connected to an input signal through a second switching device, and the second terminal of the input capacitor is coupled to a signal ground through a third switching device and coupled to the output of the switching circuit through a fourth switching device. The first terminal of the capacitor is also coupled to a signal ground through a fifth switching device. The output of the switched capacitor circuit may be connected to the input of an operational amplifier which has capacitor feedback to thereby form a switched capacitor integrator.

The shunt capacitor and switch improve charge injection linearity in two ways. First, the shunt capacitor and switch, when on, provide a low impedance bypass in parallel with the on resistance of the input switch. This improves the charge injection linearity of the third switching device by providing a nearly constant impedance at the first terminal of the input capacitor. If this bypass were not present then the input switch on resistance (which is input voltage level dependent) would dominate the impedance at the first terminal of the input capacitor. This nonlinear input voltage dependent impedance would cause the charge injection of the third switching device to vary nonlinearly with input signals. Second, the switching of the shunt capacitor network acts like a sample and hold for the nonlinear charge injection of the input switch. When the input switch injects, the shunt capacitor stores this charge injection during the charge transfer phase of the switched capacitor network. This injected charge is then available to be returned as channel charge of the input switch when a new sampling phase is entered. This improves the linearity of the input charge required by the switched capacitor circuit by removing the need for the input signal to supply the nonlinear channel charge of the input switch.

In operation the first, second, and third switching devices are conductive and the fourth and fifth switching devices are non-conductive when the input capacitor is being charged. After the input capacitor is charged, the third switching device is turned off, trapping the input voltage on the input capacitor. The charge injection of the third switching device should cause little nonlinearity because its channel charge is independent of input signal voltage. The channel charge consistently divides between the source and drain of the third switching device since the high frequency impedance at the source (signal ground) is constant, and the high frequency impedance at the drain is made nearly constant by the series combination of the input capacitance and the shunt capacitance and switch to signal ground.

After the third switch is turned off then the second switch is turned off. When the second switch is turned off its channel charge, which is nonlinearly dependent on the magnitude of the input signal and therefore varies as the input signal varies, divides between the input node and the first node. At this time the input node is still coupled to ground through the shunt capacitor and first switch. The charge coupled to ground through the shunt capacitor is stored on the shunt capacitor.

After the second switch is opened the first switch is opened which operates to isolate the charge stored on the shunt capacitor.

The fourth and fifth switches are then made conductive for the charge transfer phase. This acts to transfer the charge from the input capacitor onto to the output of the switching circuit which, in the case of a switched capacitor integrator, is applied to the feedback capacitor of the integrator. Since the first switch is not conductive when the fifth switch grounds the first terminal of input capacitor, the charge on the shunt capacitor is retained during this portion of the operation of the switch capacitor circuit.

After the fourth and fifth switches are turned off, the first, second, and third switches are turned on. This causes the channel charge which was transferred from the second switch onto the shunt capacitor during the previous cycle to be reapplied to the channel of the second switch during the present cycle. In this manner the charge injection, which otherwise would have had to be furnished by the input signal, is preserved in the circuit thus greatly diminishing the nonlinear channel charging current provided from the input signal and dissipated in the switch capacitor circuit.

Figure 1A:
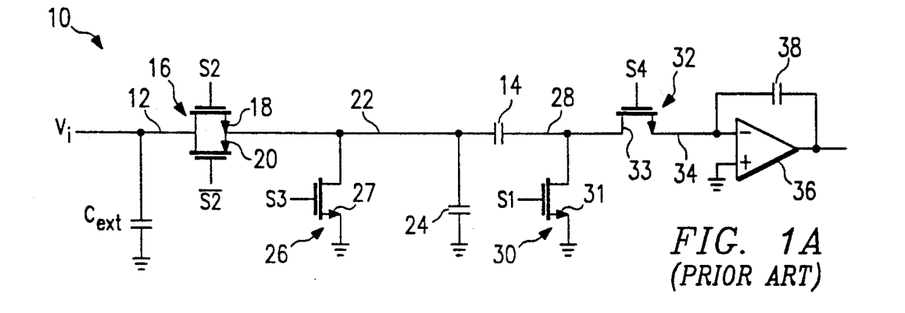
FIGS. 1A and 1B are a schematic diagram and timing diagram, respectively, of a prior art switched capacitor circuit.

Turning now to the drawings, FIG. 1A is a schematic diagram of a prior art switched capacitor circuit 10. As shown in FIG. 1A an input voltage $V_i$ having associated there with an input capacitance $C_{ext}$ is connected to an input terminal 12 of the switch capacitor circuit 10. An input capacitor 14 is coupled to the input terminal 12 through a switch 16 which consists of an n-channel and a p-channel MOS transistors 18 and 20, respectively. MOS transistors are also sometimes referred to as MOSFET transistors and IGFET transistors by those skilled in the art. The n-channel transistor 18 is driven by a signal S2 and the p-channel transistor 20 is driven by a complementary signal $\overline{S2}$. The connection between the switch 16 and input capacitor 14 forms a node 22 which is, coupled to signal ground through a shunt capacitor 24 in shunt with another switch 26 which includes an n-channel MOS transistor 27 driven by a signal S3. The other terminal of the input capacitor 14 is connected to a node 28 which in turn is coupled to ground by another switch 30 which includes an n-channel MOS transistor 31 driven by signal S1. Node 28 is coupled to an output terminal 34 of the switched capacitor circuit through a switch 32 which includes an n-channel MOS transistor 33 driven by signal S4. The output terminal 34 may for example be connected to the minus input of an operational amplifier 36 with the positive input of the amplifier connected to signal ground, and the output is fed back to the minus input of the amplifier through a feedback capacitor 38 to thereby form a switched capacitor integrator as shown in FIG. 1A.

Figure 1B:
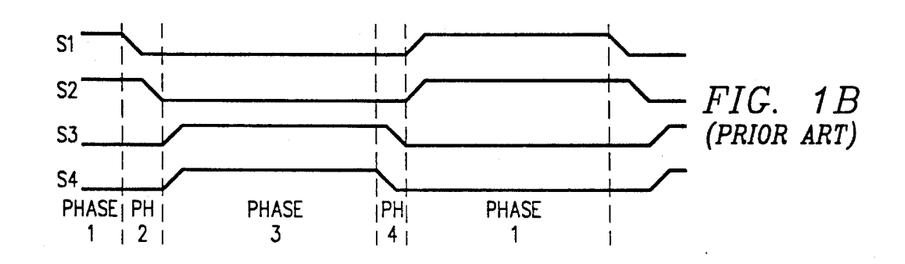

In operation, and with reference to FIG. 1B, the input capacitor 14 is charged when the switches 30 and 16 are conductive (also referred to herein as a switch being "on" or "closed") and while the switches 26 and 32 are nonconductive (also referred to herein as a switch being "off" or "open"). The input voltage charge on the input capacitor 14 is trapped on the capacitor by first opening the switch 30. The switch 30 is opened first because the channel voltage of the MOS transistor 31 of the switch 30 does not change as the input signal $V_i$ changes. Thus the first order charge injection caused by the switch 30 is constant and therefore linear. After the switch 30 has been opened then the switch 16 is opened. Since the channel charge on the switch 16, consisting of the MOS transistors 18 and 20, is nonlinearly dependant on the input voltage $V_i$, the charge injection from the switch 16 is highly nonlinear. However, since the switch 30 is open when the switch 16 injects its stored charge, the current paths from node 28 to ground are not available to change the charge on the input capacitor 14 and the nonlinear charge injection of switch 16 is insignificant in first order considerations.

Although the sequential opening of switches 30 and 16 removes first order charge injection mechanisms, high order charge injection mechanisms still cause nonlinearities in the switched capacitor circuit 10. One of the second order effects is the charge injection of switch 30. When a conducting MOS transistor switch is cut off (made nonconductive), the channel charge on the MOS transistor is divided between its source and drain nodes as a function of the high frequency impedance seen at each node. If these impedances are equal then the charge will divide equally. However, if the impedances are not equal then more of the channel charge will get injected into the low impedance side. In the circuits shown in FIG. 1A the signal ground provides a constant impedance to the source of the MOS transistor 31 in the switch 30, but, were it not for the shunt capacitor 24, the drain or signal side of the switch 30 would experience a nonlinear changing impedance because of the input voltage dependent on resistance of the switch 16 (MOS transistors 18 and 20). The resulting change in charge injection would be proportional to the change in the impedance of the switch 16 and the relative size of the channel region of the switch 30 to the input capacitor 14.

This problem is improved by the addition of the shunt capacitor 24. When appropriately sized, the high frequency impedance of the shunt capacitance 24 is much lower than the impedance of the switch 16, and the total high frequency impedance at node 22 is dominated by the shunt capacitor 24 which is constant and independent of input voltage $V_i$. The shunt capacitor 24 does not have to be excessively large because the spectrum of the charge injection phenomena of switch 30 consists of fairly high frequencies in a fine line CMOS process. This type of process is commonly used in present day integrated circuit fabrication and in the preferred embodiment of the present invention.

Another second order nonlinear injection which can be significant is the switched capacitor bias current caused by the nonlinear input voltage dependent charge injection of the switch 16. When the switch is turned off, this channel charge will divide between the circuit's input node $V_i$ and node 22. The portion of the charge transferred to node 22 and stored on the shunt capacitor 24 is then shorted to ground during the charge transfer stage (when switches 26 and 32 are conducting). When switches 16 and 30 are subsequently turned on again for another sampling phase the nonlinear channel charge that was injected from switch 16, and shunted to signal ground by switch 26, must be supplied by the input signal $V_i$. This charge injection and removal does not cause a sampling error on the input capacitor 14, but it does cause a switched capacitor input bias current to the circuit 10 which is nonlinear. If the input voltage $V_i$ is supplied from a non zero impedance voltage source, such as the output from an antialiasing filter (not shown) which is common practice in the art, then this input bias current, which is nonlinear, will introduce nonlinearities into the application of the switched capacitor circuit 10.

Figure 2A:
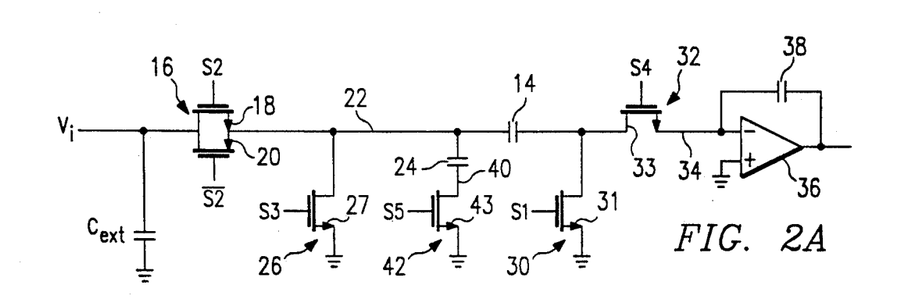
FIGS. 2A and 2B are a schematic diagram and timing diagram, respectively, of a switched capacitor circuit according to the present invention.

FIG. 2A is a schematic diagram of a switched capacitor circuit according to the present invention. As shown in FIG. 2A the shunt capacitor 24 is not connected directly to ground, but to a node 40. The node 40 is connected to ground through another switch 42 which consists of an n-channel MOS transistor 43 having its gate driven by signal S5.

Figure 2B:
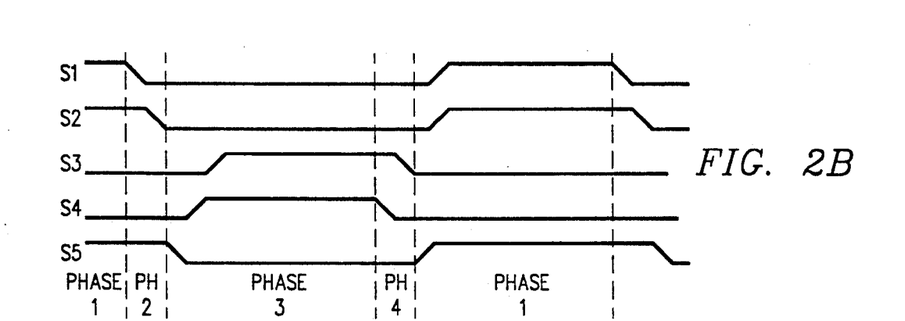

In operation, and with reference now to FIG. 2B, switches 30, 16, and 42 are closed during the sampling phase and the capacitors 14 and 24 are charged to the input voltage $V_i$. Next switch 30 is opened to trap the input charge on the input capacitor 14. During this time switch 42 is closed. The channel of the switch 42 is sized to provide a lower on resistance than the switch 16. This allows the shunt capacitor 24 to be effective in providing a linear low impedance bypass of the on resistance of the switch 16. After the switch 30 is opened the switch 16 is opened with most of its internal charge injection residing on the shunt capacitor 24. Next the switch 42 is opened to trap the charge injection of the switch 16 onto the shunt capacitor 24 so that it can be returned as channel and overlap capacitance charge to the switch 16 when the switch 16 is turned on again during the next sampling phase. In this manner the charge injection of the switch 16 discharged when the switch 16 is opened at the end of the sampling phase, is returned to the switch 16 at the beginning of the next sampling phase rather than being supplied by the input signal $V_i$.

Switches 26 and 32 then become conductive during the charge transfer phase and operate in a conventional manner to transfer the charge on the input capacitor 14 to the feedback capacitor 38 of the operational amplifier 36. After the switches 26 and 32 are opened at the end of the charge transfer operation, the switches 30, 16, and 42 are closed to initiate the next sampling phase. The sequence in which switches 30, 16, and 42 turn on is not critical as long as switch 26 is off when these switches are turned on. If switch 16 is turned on while switch 42 is off, then switch 16 will receive its channel charge initially from the input signal Vi. After switch 42 turns on, the charge from capacitor 24 will flow, at least in part, back to the input signal to replenish at least a portion of the bias current used for the channel charge on transistor 16. To illustrate this point, FIG. 2B shows switch 42 as being turned on slightly before switches 30 and 16, while in FIG. 4B switch 16 is shown as being turned on slightly before switch 42.

Although FIG. 2A shows capacitor $C_{ext}$, and the sources of transistors 27, 43, and 31 all connected to the same signal ground, it will be understood that at least three different signal references can be used in place of the single signal ground shown in FIG. 2A. For example the input signal reference (connected to capacitor $C_{ext}$) and transistor 27 can be connected to a first signal reference, transistor 31 could be connected to a second signal reference which would be the same signal reference used for the operational amplifier 36, and transistor 43 could use a third signal reference. Also, as will be understood by those skilled in the art, p-channel transistors may be used in place of the n-channel transistors 27, 43, and 31 with an appropriate change in gate drive signals for these transistors.

Figure 3A:
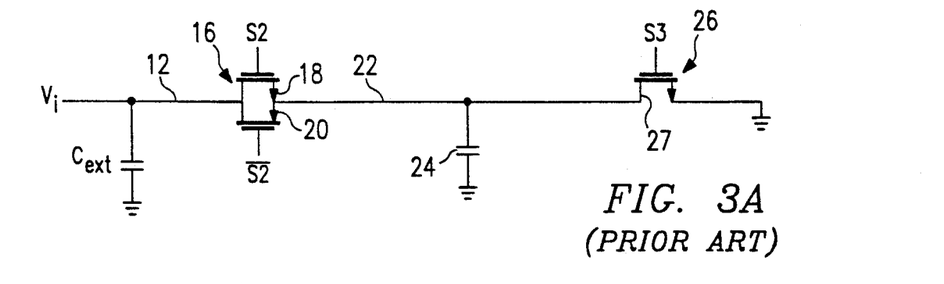
FIGS. 3A and 3B are a simplified schematic diagram and timing diagram, respectively, of the circuit of FIG. 1A during one portion of the operating cycle.
Figure 4A:
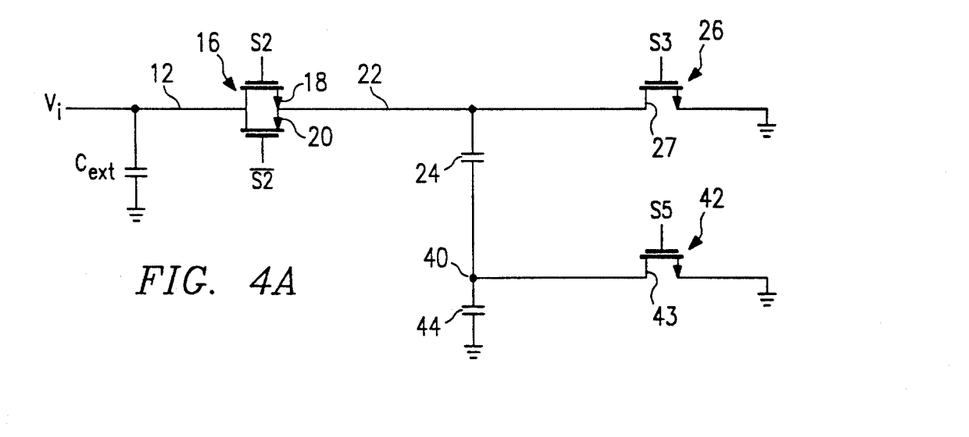
FIGS. 4A and 4B are a simplified schematic diagram and timing diagram, respectively, of FIG. 2A during one portion of the operating cycle.

FIGS. 3A and 4A will be used to analyze the charge injection from the switch 16 while the other switches will be considered ideal with no charge injection. This idealization does not effect the results for nonlinear input currents because both switches 26 and 42 are kept at constant channel potentials so that their charge injections are constant.

For the analysis of FIGS. 3A and 4A the capacitor charge is represented by $C_{name} \cdot V$ or $Q_{capname}$. The charge injection of switch 16 is $Q_{t16(to\ node\#)}$. The channel charge plus the overlap capacitance charge of the switch 16 is always conserved and the charge of a conducting switch 16 is allocated to the nodes on each side of the switch in the same ratio as the expected charge transfer when the switch is opened. This charge is denoted by $Q_{node\#}$ and is equal to $Q_{t16(node\#)}$ of the on switch.

Figure 3B:
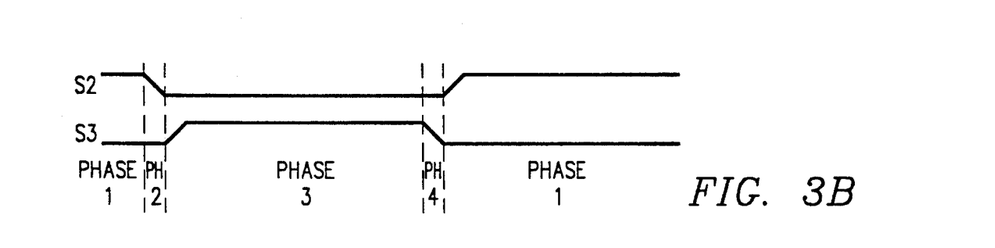

Turning now to FIG. 3A which represents the circuit shown in FIG. 1A, and with reference to FIG. 3B, during phase 1 switch 16 is on and switch 26 is off. Both capacitors $C_{ext}$ and $C_{24}$ are charged to $V_i$ and the channel charge and overlap capacitance charge of switch 16 is represented by $Q_{t16Vi}$ and $Q_{t1622}$. The $Q_{t16Vi}$ and $Q_{t1622}$ portions of the charge are transferred to $V_i$ and node 22 respectively when the switch 16 is turned off. The charge status at the end of phase 1 is as follows:

$Q_{Cext} = V_i C_{ext}\ Q_{vi} = Q_{t16Vi}$ $Q_{24} = V_i C_{24}\ Q_{22} = Q_{t1622}$ Phase 2 shuts off the input switch 16. The channel charge on switch 16 is transferred to $C_{ext}$ and $C_{24}$ as follows:

$Q_{Cext} = V_i C_{ext} + Q_{t16Vi}\ Q_{Vi} = 0$ $Q_{24} = V_i C_{24} + Q_{t1622}\ Q_{22} = 0$ Phase 3 turns on switch 26 shorting node 22 to ground. This shorts out the charge stored on $C_{24}$ from phase 2 leaving:

$$Q_{Cext} = V_iC_{exti} + Q_{t1622}\, Q_{Vi}0$$

$$Q_{24} = 0 \quad Q_{22} = 0$$

Phase 4 opens switch 26 leaving the charge of phase 3 in place.

At this point the cycle repeats itself with the closing of switch 16 which returns the circuit back to phase 1. Thus the only time the switch 16 is closed is during phase 1. If the charge that is present at the nodes $V_i$ and 22 at the end of phase 1 are subtracted from the same node charges at the end of the preceding phase 4, the input charge per cycle, or input current, can be calculated. Phase 1 charge is:

$$V_iC_{ext} + V_iC_{24} + Q_{t16Vi} + Q_{t1622}$$

Phase 4 charge is:

$$V_iC_{ext} + Q_{t22Vi}$$

The difference in these charges Qi must come from the input through switch 16 on each sampling cycle.

$$Q_i = V_iC_{24} + Q_{t1622}$$

The input current is then Qi·f where f is the sampling frequency.

In the above equation for $Q_i$ the $V_iC_{24}$ term is linear to the extent capacitor 24 is linear which, in today's technology, can approach one part per million. The nonlinear term that must be compensated for is the $Q_{t1622}$ charge which is highly nonlinear versus input voltage, $V_i$, in a MOS sampling switch.

Figure 4B:
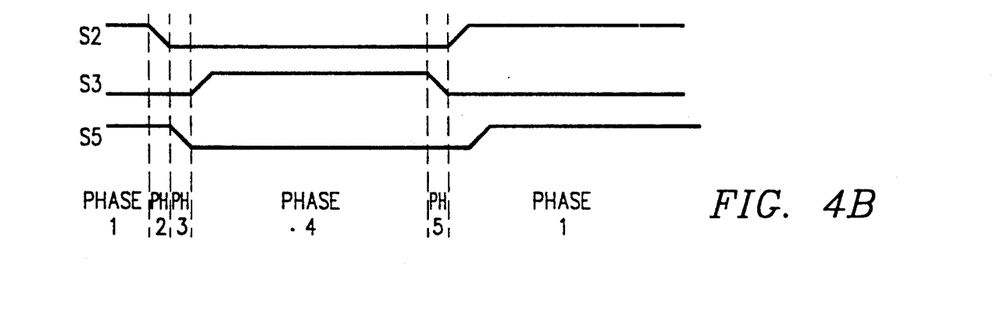

FIG. 4A is a schematic diagram of the circuit shown in FIG. 2A which is a switched capacitor circuit according to the present invention. With reference now to FIGS. 4A and 4B during phase 1 switch 16 and 42 are closed, and switch 26 is open. The charges present at the end of the first phase are:

$$Q_{Cext} = V_iC_{ext}$$

$$Q_{vi} = Q_{t16Vi}$$

$$Q_{24} = V_iC_{24}$$

$$Q_{22} = Q_{t1622}$$

$$Q_{C44} = 0$$

where the $Q_{C44}$ charge represents charge on the stray capacitance, $C_{44}$, at node 40. Phase 2 opens switch 16 which isolates node 22 from the input and injects the channel and overlap capacitance charge from the switch 16 to the nodes $V_i$ and 22. The charge state becomes:

$$Q_{Cext} = V_iC_{ext} + Q_{t16Vi}$$

$$Q_{24} = V_iC_{24} + Q_{t1622}$$

$$Q_{C44} = 0$$

$$Q_{Vi} = 0$$

$$Q_{22} = 0$$

phase 3 opens switch 42 leaving the charge state identical to phase 2 above.

During phase 4 the closing of switch 26 shorts node 22 to ground and transfers part of the charge on $C_{24}$ to $C_{44}$. The resulting charge state is $$Q_{Cext} = V_iC_{ext} + Q_{t16Vi}$$

$$Q_{24} = (V_iC_{24} + Q_{t1622})\frac{C_{24}}{C_{24} + C_{44}}$$

$$Q_{44} = (V_iC_{24} + Q_{t1622})\frac{C_{44}}{C_{24} + C_{44}}$$

$$Q_{Vi} = 0$$

$$Q_{22} = 0$$

Phase 5 simply opens switch 26 leaving the charge state of phase 4 unaltered.

The next phase is a new phase 1 where nodes $V_i$ and 22 are shorted together by the switch 16. The channel charge of switch 16 must be reestablished and any change in charge on $C_{24}$ and $C_{ext}$ must be replaced by charge from the input $V_i$. To calculate the charge input, $Q_i$, during phase 1 the preceding phase 5 charge must be subtracted from the phase 1 charge for nodes $V_i$ and 22.

$$Q_i = V_iC_{ext} + V_iC_{24} + Q_{t16Vi} + Q_{t1622} -$$
$$\left[ V_iC_{ext} + Q_{t16Vi} + (V_iC_{24} + Q_{t1622})\left(\frac{C_{24}}{C_{44} - C_{24}}\right) \right]$$

$$Q_i = V_iC_{24}\left(1 - \frac{C_{24}}{C_{44} + C_{24}}\right) + Q_{t1622}\left(1 - \frac{C_{24}}{C_{44} + C_{24}}\right)$$

In the above equation for $Q_i$ the first term is linear to the extent that the capacitor $C_{24}$ and $C_{44}$ are linear. The nonlinear term is:

$$Q_{t1622}\left[1 - \left(\frac{C_{24}}{C_{44} + C_{24}}\right)\right]$$

For modern CMOS integrated circuits the stray capacitance of a switched capacitor node is approximately 5% of the switched capacitor value. Substituting 0.05 $C_{24}$ for $C_{44}$ in the above equations leaves:

$$Q_{t1622}\left[1 - \left(\frac{C_{24}}{1.05C_{24}}\right)\right]$$

Reducing to $$0.047 \cdot Q_{t1622}$$

The remaining nonlinear charge component, $Q_i$, for the circuit of FIG. 4A is $0.047 \cdot Q_{t1622}$ compared to the circuit of FIG. 3A which is $Q_{t1622}$. The nonlinear input charge or current caused by the charge injection of switch 16 has been reduced by approximately 95%.

Figure 5:
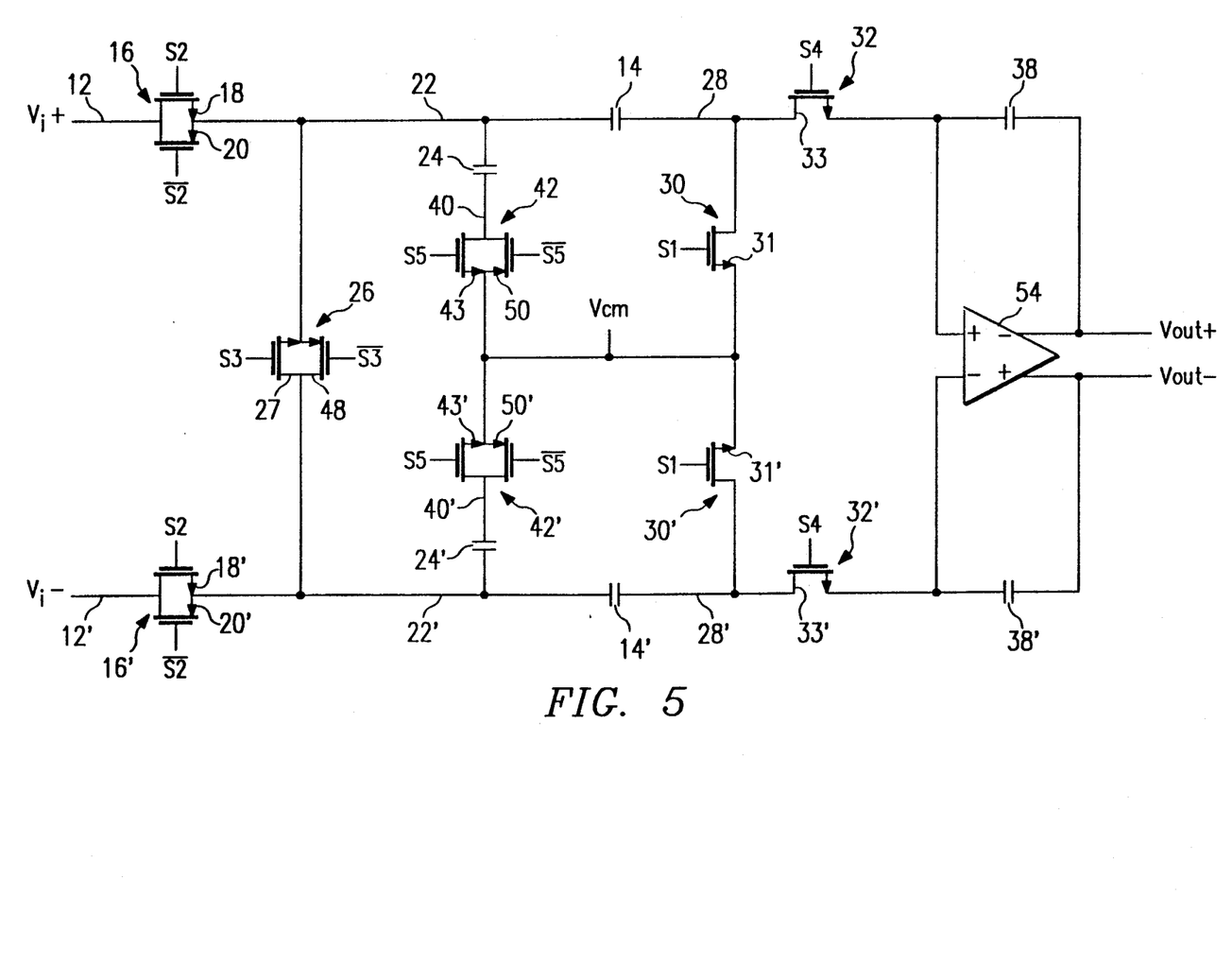
FIG. 5 is a schematic diagram of a preferred embodiment of the present invention.

FIG. 5 is a schematic diagram of the preferred embodiment of present invention which is a fully differential switched capacitor circuit. As shown in FIG. 5 differential $V_i+$ and $V_i-$ are sampled and integrated to provide differential output Vout+ and Vout−. As shown in FIG. 5 $V_i+$ and $V_i-$ are coupled to nodes 22 and 22' through switches 16 and 16' respectively. Switch 16 has an n-channel transistor 18 driven by signal S2, and a p-channel transistor 20 driven by signal $\overline{S2}$ which is the complement of signal S2. Switch 16' has an n-channel transistor 18' driven by signal S2, and a p-channel transistor 20' driven by signal $\overline{S2}$. Nodes 22 and 22' are coupled together by switch 26 which in FIG. 5 includes both the n-channel transistor 27 driven by signal S3 and a p-channel transistor 48 driven by signal $\overline{S3}$ which is the complement of signal S3. The shunt capacitor 24 and switch 42 are connected between node 22 and a common mode voltage node Vcm. The switch 42 includes the n-channel transistor 43 driven by signal S5 and a p-channel transistor 50 driven by signal $\overline{S5}$ which is the complement of the signal S5. The node 22' is also coupled to the common mode voltage node Vcm through a shunt capacitor 24' and a switch 42'. The switch 42' includes an n-channel transistor 43' driven by signal S5 and a p-channel transistor 50' driven by a signal $\overline{S5}$.

The input capacitor 14 couples node 22 to node 28, and similarly a complementary input capacitor 14' couples node 22' to node 28'. Node 28 is coupled to the common mode voltage node Vcm through the switch 30 which includes the n-channel transistor 31 which is driven by signal S1. Similarly, node 28' is coupled to the common mode voltage node Vcm by a switch 30' which includes an n-channel transistor 31' driven by signal S1. The switch 32 couples the node 28 to the plus input of an fully differential operational amplifier 54. The switch 32 includes the n-channel transistor 33 which is driven by signal S4. The negative output of the operational amplifier 54 forms the output signal Vout+ and is fed back to the positive input of the amplifier through the feedback capacitor 38. The node 28' is coupled through a switch 32' to the minus input of the operational amplifier 54. The switch 32' includes an n-channel transistor 33' driven by signal S4. The positive output of the operational amplifier 54 forms the Vout− output and is coupled to the minus input of the amplifier through a feedback capacitor 38'.

The circuit of FIG. 5 operates in the same manner as the description of FIG. 2 above except in a fully differential manner as will be understood by those skilled in the art. The switch 26 connects directly between nodes 22 and 22' instead of coupling these nodes to a common mode voltage node. This allows the differential operation of the circuit to be independent of input common mode voltage. If no common mode input signal is present then switch 26 can be coupled between node 22 and the common mode voltage node Vcm, and a complementary switch 26' can be coupled between node 22' and the common mode voltage node Vcm thereby forming the exact differential implementation of the circuit of FIG. 2A.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A capacitor charging circuit comprising:
   a) a first switch coupled between an input signal and a first terminal of the capacitor;
   b) a series combination of a shunt capacitor and a second switch coupled between said first terminal and a first signal reference;
   c) a third switch coupled from a second terminal of the capacitor and a second signal reference; and
   d) wherein said first and second switches are conductive when said third switch changes from a conductive to a nonconductive state, said second switch is conductive and said third switch is nonconductive when said first switch changes from a conductive to a nonconductive state, the charge on said shunt capacitor remaining essentially constant when said second switch is nonconductive.

2. A capacitor charging circuit as set forth in claim 1 wherein said first signal reference and said second signal reference are signal ground.

3. A switched-capacitor circuit for receiving an input signal at an input terminal and for providing an output signal at an output terminal, comprising:
   a) a first switching device coupled between said input terminal and a first node;
   b) a series capacitor having a first terminal coupled to said first node and a second terminal coupled to a second node;
   c) a shunt capacitor coupled between said first node and a third node;
   d) a second switching device coupled between said third node and a first signal reference;
   e) a third switching device coupled between said first node and a second signal reference;
   f) a fourth switching device coupled between said second node and a third signal reference;
   g) a fifth switching device coupled between said second node and said output terminal; and
   h) wherein said first and second switches are conductive when said fourth switch changes from a conductive to a nonconductive state, said second switch is conductive when said first switch changes from a conductive to a nonconductive state, and the charge on said shunt capacitor remaining essentially constant when said second switch is nonconductive.

4. A switched-capacitor circuit as set forth in claim 3 wherein said first signal reference, said second signal reference, and said third signal reference are signal ground.

5. In a switched capacitor circuit having an input switch coupled between an input signal and a first node, a series capacitor coupled between said first node and a second node, and a shunt capacitor coupled between said first node and signal ground, the improvement comprising adding a second switching device between said shunt capacitor and signal ground and timing the switching of said input switch and said second switch such that the channel charge present in said input switch when said input switch is conductive, is transferred, at least in part, to said shunt capacitor by turning off said input switch while said second switch is conductive, then turning off said second switch to preserve the charge on said shunt capacitor, and turning on said second switch to transfer at least a part of said charge preserved on said shunt capacitor onto said input switch when said input switch is conductive again.

6. A switched-capacitor integrator for receiving an input signal at an input terminal and for providing an integrated output signal at an output terminal, comprising:
a) a first switching device coupled between said input terminal and a first node;
b) a series capacitor having a first terminal coupled to said first node and a second terminal coupled to a second node;
c) a shunt capacitor coupled between said first node and a third node;
d) a second switching device coupled between said third node and a first signal reference;
e) a third switching device coupled between said first node and a second signal reference;
f) a fourth switching device coupled between said second node and a third signal reference;
g) a fifth switching device coupled between said second node and a fourth node;
h) an operational amplifier having a positive input coupled to a fourth signal reference, a minus input coupled to said fourth node, and an output coupled to said output terminal, said operational amplifier having a feedback capacitor coupled from said output to said minus input of said operational amplifier; and
i) wherein said first and second switches are conductive when said fourth switch changes from a conductive to a nonconductive state, said second switch is conductive when said first switch changes from a conductive to a nonconductive state, said second switching device is nonconductive when said third switching device is conductive, and the charge on said shunt capacitor remaining essentially constant when said second switch is nonconductive.

7. A switched-capacitor circuit as set forth in claim 6 wherein said first signal reference, said second signal reference, said third signal reference, and said fourth signal reference are signal ground.

8. A differential switched-capacitor circuit for receiving positive and negative input signals at positive and negative input terminals and for providing true and complementary output signals at true and complementary output terminals, comprising:
a) a first switching device coupled between said positive input terminal and a first node;
b) a second switching device coupled between said negative input terminal and a second node;
c) a first series capacitor having a first terminal coupled to said first node and a second terminal coupled to a third node;
e) a second series capacitor having a first terminal coupled to said second node and a second terminal coupled to a fourth node;
f) a first shunt capacitor coupled between said first node and a fifth node;
g) a second shunt capacitor coupled between said second node and a sixth node;
h) a third switching device coupled between said fifth node and a first signal reference;
i) a fourth switching device coupled between said sixth node and said first signal reference;
j) a fifth switching device coupled between said first node and said second node;
k) a sixth switching device coupled between said third node and said signal reference;
l) a seventh switching device coupled between said fourth node and said signal reference;
m) an eighth switching device coupled between said third node and said true output terminal; and
n) an ninth switching device coupled between said fourth node and said complementary output terminal; and
o) wherein said first, second, third, and fourth switches are conductive when said sixth and seventh switches change from a conductive to a nonconductive state, and said third and fourth switches are conductive when said first and second switches change from a conductive to a nonconductive state, said third and fourth switching devices are nonconductive when said fifth switching device is conductive, and the charge on said first and second shunt capacitors remaining essentially constant when said third and fourth switching devices, respectively, are nonconductive.

9. A stored charge retention circuit comprising:
a) an active device having a first terminal thereof coupled to an input terminal for receiving an input signal, said active device having a stored charge when said active device is conductive, said active device dispersing said stored charge when said active device changes to a nonconductive state;
b) a capacitive element having a first end coupled to a second terminal of said active device;
c) a switching device coupled between a second end of said capacitive element and a reference potential, said switching device forming a conductive path from said capacitive element to said reference potential when said active device is changing from a conductive state to a nonconductive state such that at least a portion of the stored charge dispersing through said second terminal is transferred onto said capacitive element;
d) said switching device also forming a conductive path from said capacitive element to said reference potential when said active device is in a conductive state again such that charge from said capacitive element is transferred to said active device to supply, at least in part, the amount of the charge stored in said active device; and
e) said switching device isolating said capacitive element from said reference potential at least a portion of the time that said active device is nonconductive in order to retain said dispersed charge on said capacitive element transferred from said active device when said active device changed from a conductive state to a nonconductive state until said active device is conductive again.

10. A method for storing a charge on a capacitor comprising the steps of:
a) passing an input signal through a first switching device onto a first terminal of a series capacitor while a second terminal of said capacitor is coupled to ground through a second switching device, and said first terminal of said series capacitor is also coupled to ground through the series combination of a shunt capacitor and a third switching device;
b) opening said second switching device while said first and third switching devices are conductive;
c) opening said first switching device while said third switching device is conductive and said second switching device is nonconductive; and
d) opening said third switching device while said first and second switching devices are nonconductive so that the charge on said shunt capacitor remains essentially constant when said third switch is nonconductive.

11. A method for retaining a charge which has been stored on an active device when it is conductive comprising the steps of:
   a) making said active device change from a conductive state to a nonconductive state while transferring at least a portion of said stored charge which is dispersed through a terminal of said active device onto a capacitive element which is coupled from said active device to a reference potential;
   b) isolating said capacitive element from said reference potential for at least a portion of the time said active device is nonconductive such that said portion of said stored charge transferred to said capacitive element is retained on said capacitive element; and
   d) coupling said capacitive element to said reference potential such that said charge on said capacitive element is used, at least in part, to supply the amount of the charge stored on said active device when said active device is conductive again.

* * * * *